United States Patent [19]
Kleiner

[11] Patent Number: 5,976,258
[45] Date of Patent: Nov. 2, 1999

[54] HIGH TEMPERATURE SUBSTRATE TRANSFER MODULE

[75] Inventor: Timothy Norpell Kleiner, Los Gatos, Calif.

[73] Assignee: Semiconductor Equipment Group, LLC, Scotts Valley, Calif.

[21] Appl. No.: 09/019,349

[22] Filed: Feb. 5, 1998

[51] Int. Cl.⁶ ..................................................... C23C 16/46
[52] U.S. Cl. ........................ 118/718; 118/724; 118/725; 219/388; 392/417; 392/418; 414/147; 414/150; 414/152; 414/157; 414/210; 414/211; 414/287; 414/288; 414/304; 414/325; 414/327; 414/935; 432/121; 427/225.28; 427/225.29
[58] Field of Search ..................................... 118/718, 724, 118/725; 432/121, 128, 164; 219/388; 392/417, 418; 414/150, 152, 157, 210, 211, 287, 288, 304, 325, 327, 586, 935, 937, 147; 427/225.28, 225.29

[56] References Cited

U.S. PATENT DOCUMENTS

| | | | |
|---|---|---|---|
| 4,913,090 | 4/1990 | Harada et al. | 118/724 |
| 5,129,360 | 7/1992 | Ahern et al. | 118/724 |
| 5,814,153 | 9/1998 | Ishikawa | 118/724 X |

*Primary Examiner*—Milton Cano
*Attorney, Agent, or Firm*—Flehr Hohbach Test Albritton & Herbert LLP

[57] ABSTRACT

A system and method for processing a substrate. The system includes a substrate heating station, a processing station, a conveyor for transporting the heated substrate from the substrate heating station to the processing station and a conveyor heating station. A substrate transfer station is located between the substrate heating station, the conveyor heating station and the processing station for the transfer of the heated substrate to the conveyor in a thermally controlled environment isolated from contaminants. The substrate transfer station includes a housing having an interior chamber, first and second inlets for the separate passage of a substrate and conveyor into the interior chamber, and an outlet for the egress of the substrate and conveyor. The transfer station also includes a heater and a guide assembly for directing the conveyor between the conveyor inlet and the outlet. The method includes heating a substrate, heating a conveyor and moving the heated conveyor through an enclosure, moving the heated substrate into the enclosure through a separate inlet port and positioning the heated substrate on the heated conveyor in the interior chamber, moving the heated conveyor and substrate through the outlet port of the enclosure, and moving the heated conveyor and substrate through at least one processing station.

18 Claims, 4 Drawing Sheets

HIGH TEMPERATURE SUBSTRATE TRANSFER MODULE

BRIEF DESCRIPTION OF THE INVENTION

This invention relates in general to a system for processing a substrate and, more particularly, to a thermal conditioning system for use in atmospheric pressure chemical vapor deposition.

BACKGROUND OF THE INVENTION

Chemical vapor deposition (CVD) systems are used to form a thin, uniform layer or film on a substrate such as a semiconductor wafer. During CVD processing, the substrate is exposed to one or more chemical vapors such as silane, phosphane, diborane and the like, and gaseous substances such as oxygen. The gases mix and interact with the other gases and/or the surface of the substrate to produce the desired film. The desired reactions generally occur at elevated temperatures, for example 300° C. to 500° C., with the substrate and chamber being heated to the appropriate temperature for a selected process. In many applications including semiconductor processing, film characteristics such as purity and thickness uniformity must meet high quality standards.

In general, CVD systems include an injector positioned to inject chemical reagents and other gaseous substances into a clean, isolated reaction chamber. For processing occurring at atmospheric pressure, the substrate, for example a thin glass substrate, is often carried through one or more chambers on a conveyor. As the substrate travels toward the processing chamber, the substrate and the conveyor carrying the substrate are heated by heaters positioned adjacent to the conveyor as the conveyor and substrates move together toward the processing chambers. To heat the substrate and conveyor to the desired temperatures without damaging the substrate, the conveyor typically moves the substrate along a heating path having a length of about six feet before the substrate reaches the first reaction chamber. After processing, the substrate is carried along a cooling path of a similar length, requiring that the CVD system occupy about twelve feet solely for heating and cooling the substrate before and after processing. A thermal conditioning system requiring a smaller footprint to heat and cool the substrate would reduce the size of the overall system, allowing the system to be operated in a smaller area. Heating the substrate as it is carried by the conveyor heats the leading edge of the substrate first, producing a thermal gradient in the substrate during the heating process. This thermal gradient may have adverse effects on the substrate or materials previously deposited on the substrate. A heating system which uniformly heats the substrate is desirable. Similarly, a system which thermally conditions the conveyor before a substrate is deposited on the conveyor is desirable. A system in which the heated substrate is transferred to the heated conveyor in a heated and contaminant free compartment is also desirable.

OBJECTS AND SUMMARY OF THE INVENTION

It is a primary object of the present invention to provide a system for thermally conditioning a substrate.

It is another object of the present invention to provide a system for thermally conditioning a conveyor before the conveyor contacts the heated substrate.

It is still another object of the present invention to provide a system for transferring the heated substrate to the heated conveyor in a thermally controlled environment.

It is yet another object of the present invention to provide a system in which the substrate is substantially isolated from particulate contamination when it is transferred to the heated conveyor.

A more general object of the present invention is to provide an efficient, economical system for thermally conditioning a substrate and conveyor and handling a substrate during processing.

In summary, this invention provides a system and method for conditioning a substrate in which the heated substrate is transferred to the heated conveyor in a thermally controlled, contaminant-free environment. The system includes a substrate heating station for heating a substrate to an elevated temperature, a processing station for treating the heated substrate, and a conveyor for transporting the heated substrate from the heating station to the processing station. The system also includes a conveyor heating station for heating the conveyor to an elevated temperature before the heated substrate is positioned on the conveyor. A substrate transfer station is located between the substrate heating station, the conveyor heating station and the processing station for the transfer of the heated substrate to the conveyor. The substrate transfer station includes a housing having a substrate inlet port positioned to receive a heated substrate from the substrate heating station, a conveyor inlet port for the entry of the conveyor into the housing, and an outlet port for the egress of the conveyor and a heated substrate positioned thereon. The substrate transfer station including a heater for heating the interior of the housing to an elevated temperature and a guide assembly turning the conveyor between the conveyor inlet and the outlet.

The method includes heating a substrate to an elevated temperature, heating a conveyor to an elevated temperature and moving the heated conveyor through an enclosure. The enclosure has an interior chamber heated to an elevated temperature, an inlet port for the passage of the heated conveyor into the interior chamber, and an outlet port for the egress of the heated conveyor from the interior chamber. The heated substrate is moved into the enclosure through a separate inlet port and positioned on the heated conveyor in the interior chamber of the enclosure. The method further includes moving the heated conveyor with the heated substrate positioned thereon through the outlet port of the enclosure and moving the heated conveyor and the heated substrate through at least one processing station for processing of the heated substrate.

Additional objects and features of the invention will be more readily apparent from the following detailed description and appended claims when taken in conjunction with the drawings.

DETAILED DESCRIPTION OF THE INVENTION

Figure 1:
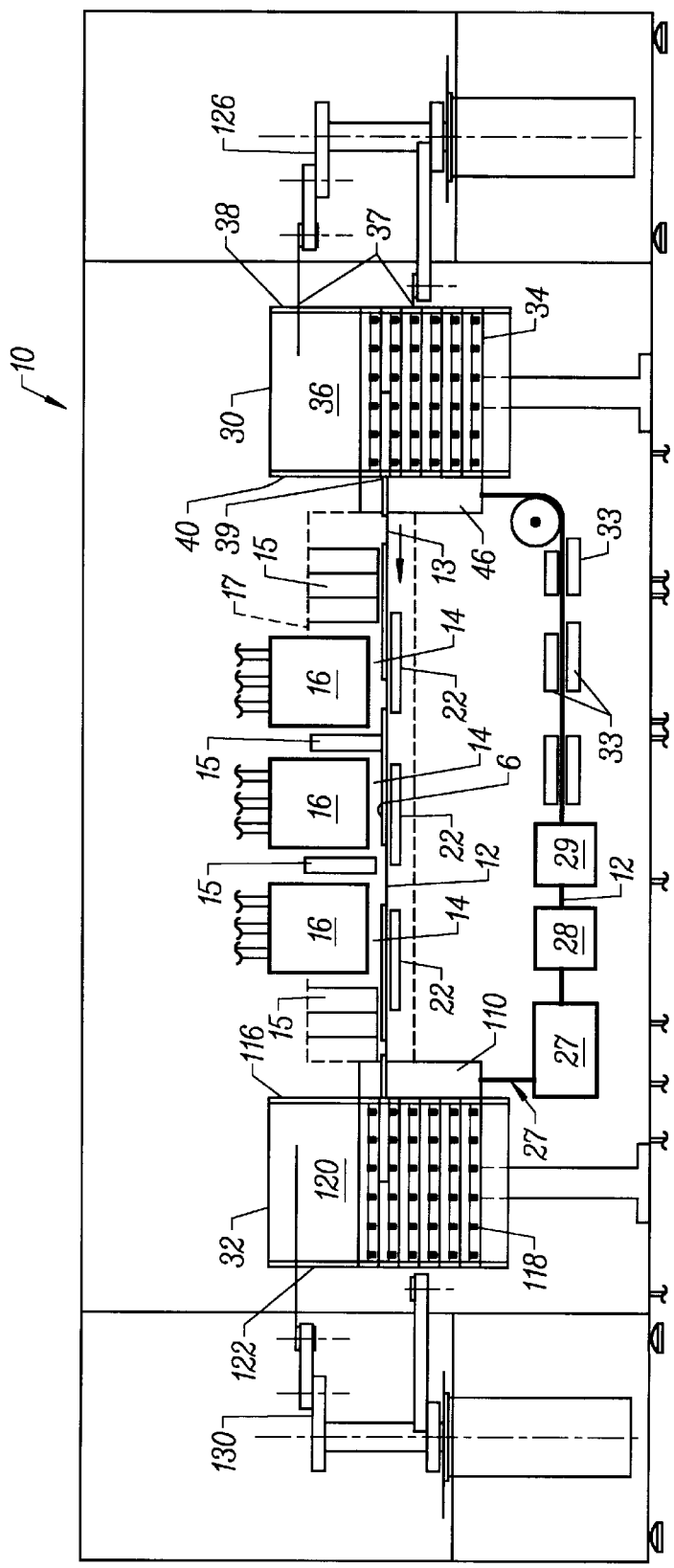
FIG. 1 is a schematic, front plan view of a processing system in accordance with the present invention.

Reference is now made in detail to the preferred embodiment of the invention, which is illustrated in the accompanying figures. Turning now to the drawings, wherein like components are designated by like reference numerals throughout the various figures, attention is directed to FIG. 1 and 2.

Figure 2:
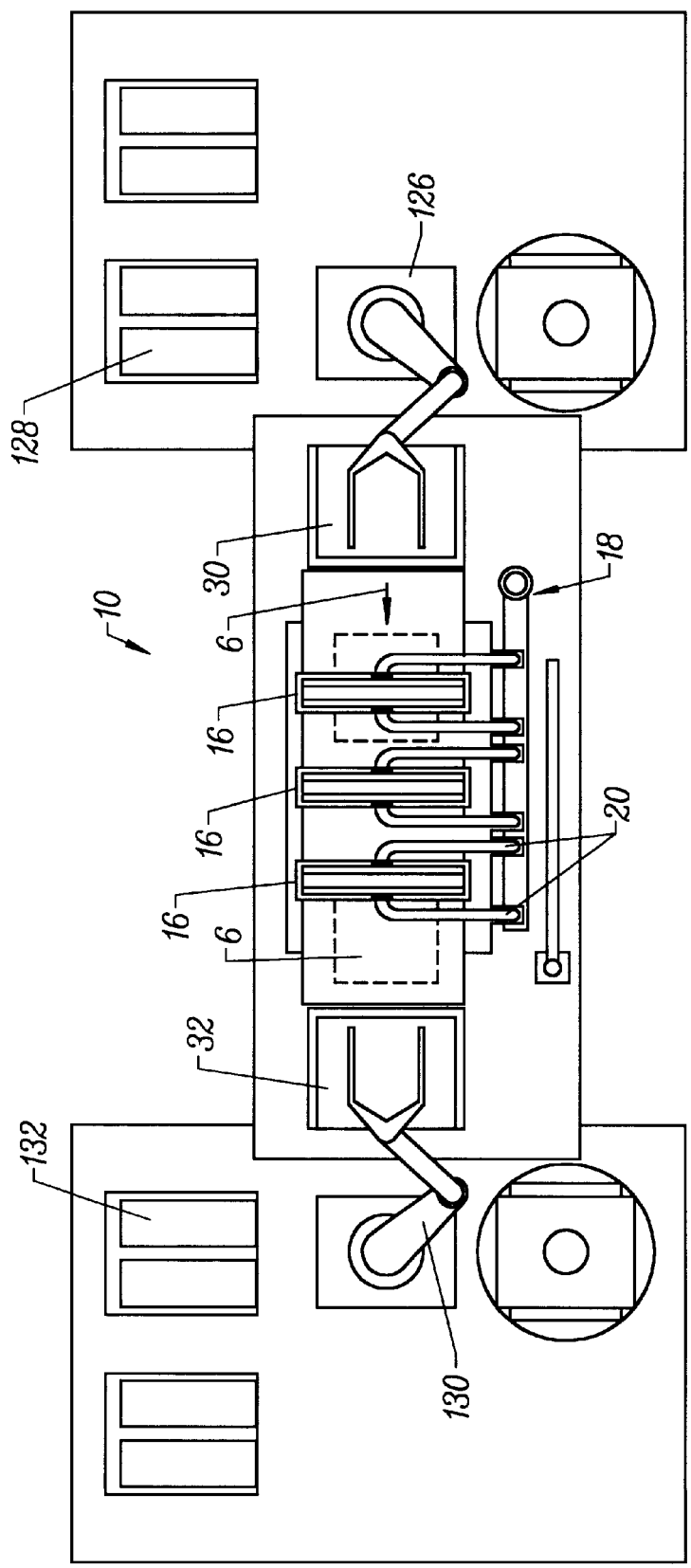
FIG. 2 is a schematic top plan view of a processing system in accordance with the present invention.

FIGS. 1 and 2 schematically illustrate an APCVD system 10 which is suitable for handling and processing substrates 6, in particular glass substrates, although the system 10 may also be used with other substrates such as semiconductor wafers and the like. The system 10 is of particular advantage when employed in the processing of the glass substrates. Heated semiconductor wafers may be easily handled with ordinary care without damaging the wafers. However, glass substrates are formed of a brittle which must be handled carefully to avoid cracking or damaging the substrate. With the APCVD system of this invention, the glass substrates may be efficiently heated, cooled and handled while minimizing the risk of cracking, marring or otherwise damaging the glass substrate.

The APCVD system 10 generally includes a conveyor belt 12 which carries the individual substrates in a process path 13 extending through one or more reaction chambers 14. The conveyor is moved by a drive system as is known in the art. In the illustrated embodiment, the system 10 includes three chambers 14 although it is to be understood that the number and actual configuration of each reaction chamber 14 is subject to considerable variation depending upon the specific constraints of each application. The reaction chambers 14 are partially defined by baffles 15 which inject a stream of inert gas such as nitrogen toward the conveyor 12 to form a gas curtain between the adjacent chambers. Injectors 16 are positioned above the conveyor 12 to inject the process gases into each reaction chamber 14 as the substrate 6 travels through the chamber. The injected substances react with each other and/or with the upper surface of the substrate 6 to form a thin, uniform layer or film. The actual reagents used in the CVD process depends in part upon the type and quality of film desired. In one application of the processing system 10, the injector 16 is coupled to a silicon source reactant such as silicon, silane or disilane, nitrogen, and if desired a dopant source reactant such as TMP, TMB, phosphine and/or diborane. Oxygen or a combination of oxygen and ozone is delivered through other ports of the injector 16, with a stream of an inert gas such as pure nitrogen separating the silicon source reactant from the oxygen mixture until the gases approach the substrate surface. A muffle 17 encloses the components of the system 10, isolating the reaction chambers 14 from the atmosphere outside of the processing system 10. As shown in FIG. 2, an exhaust system, generally designated 18, including vents 20 positioned on opposite sides of the injector 16 removes unused process gases and reaction by-products from the chambers 14. Heaters 22 maintain the reaction chambers 14, the conveyor 12 and the heated substrates 6 at the desired temperature during processing. The conveyor 12, chambers 14, injectors 16, exhaust system 18 and heaters 22 are components of conventional APCVD systems and are subject to considerable variation within the scope of this invention.

Thermal conditioning apparatus 30 and 32 are positioned at opposite ends of the reaction path of the conveyor 12 to thermally condition the substrates separately from the conveyor belt before and after processing. The thermal conditioning apparatus 30, 32 are of the type shown in the co-pending application Serial No. (Flehr Hohbach Test Albritton & Herbert LLP File No. A-63676/AJT), incorporated herein by reference. Instead of the thermal conditioning apparatus 30 and 32, it is to be understood that other means may be used to pre-heat the substrates for processing and cool the processed substrates to a manageable handling temperature.

The thermal conditioning apparatus 30 generally includes a carriage 34 positioned in a heating chamber 36. Substrates are inserted through one of two inlet ports 37 in the back wall 38 of the chamber 36 and deposited on one of the shelves of the carriage 34. The carriage is indexed vertically within the chamber, consecutively aligning one shelf of the carriage 34 with an outlet port 39 formed in the front wall 40 of the chamber for removal of the heated substrate through the outlet port. The timing and movement of the carriage 34 relative to the inlet and outlet ports 37, 39 is arranged such that each substrate remains in the chamber 36 until the substrate is heated to the desired temperature. For the illustrated application, the conditioning apparatus 30 preheats the substrate to a temperature of about 430° C., or higher if required for a specific process, so that the substrate 6 enters the first reaction chamber 14 at a temperature at an acceptable range for the chemical reactions for processing, for example 300° C. to 500° C. After the heated substrate is ejected from the conditioning apparatus 30, the substrate is deposited on the conveyor 12 for transport through the processing chambers 14.

Unlike the prior art, where the conveyor and substrates are simultaneously heated and cooled before and after processing, the conveyor 12 is heated separately from the substrates after it has been cooled and cleaned. The return path 26 of the system includes a conveyor cooling station 27, a cleaning station 28 and a drying station 29. In the present embodiment, the cooling station 27 includes one or more water cooled rollers for cooling the conveyor although other means may be used to cool the conveyor. For optimum efficiency during cleaning, the conveyor is preferably cooled to a temperature at or near room temperature. In the dealing station 28, HF vapor is used to clean the conveyor and the conveyor is then rinsed. In the drying station 29, forced hot air dries the rinsed conveyor. Cleaning the conveyor after each pass through the process path 13 removes the film deposited on the conveyor in the reaction chambers 14, ensuring the substrates 6 are positioned on a clean surface. After this cleaning process, the conveyor passes one or more heaters 33 which heat the conveyor to the processing temperature. In the present embodiment of the invention, heaters 33 are radiant electric heaters. However, other suitable heaters such as infrared lamps may be employed.

When the substrate is heated to high temperatures, such as a temperature in the range of 300° C. to 500° C., the substrate is particularly susceptible to contaminants and damage as for example cracking of the substrate or marring of the bottom surface of the substrate. To protect the hot substrates from damage, the processing system 10 of this invention includes a substrate transfer station 46 positioned between the thermal conditioning apparatus 30 and the processing path of the conveyor 12. The substrate transfer station 46 provides a clean, thermally controlled environment in which the substrate is transferred to the upper surface of the conveyor 12.

Figure 3:
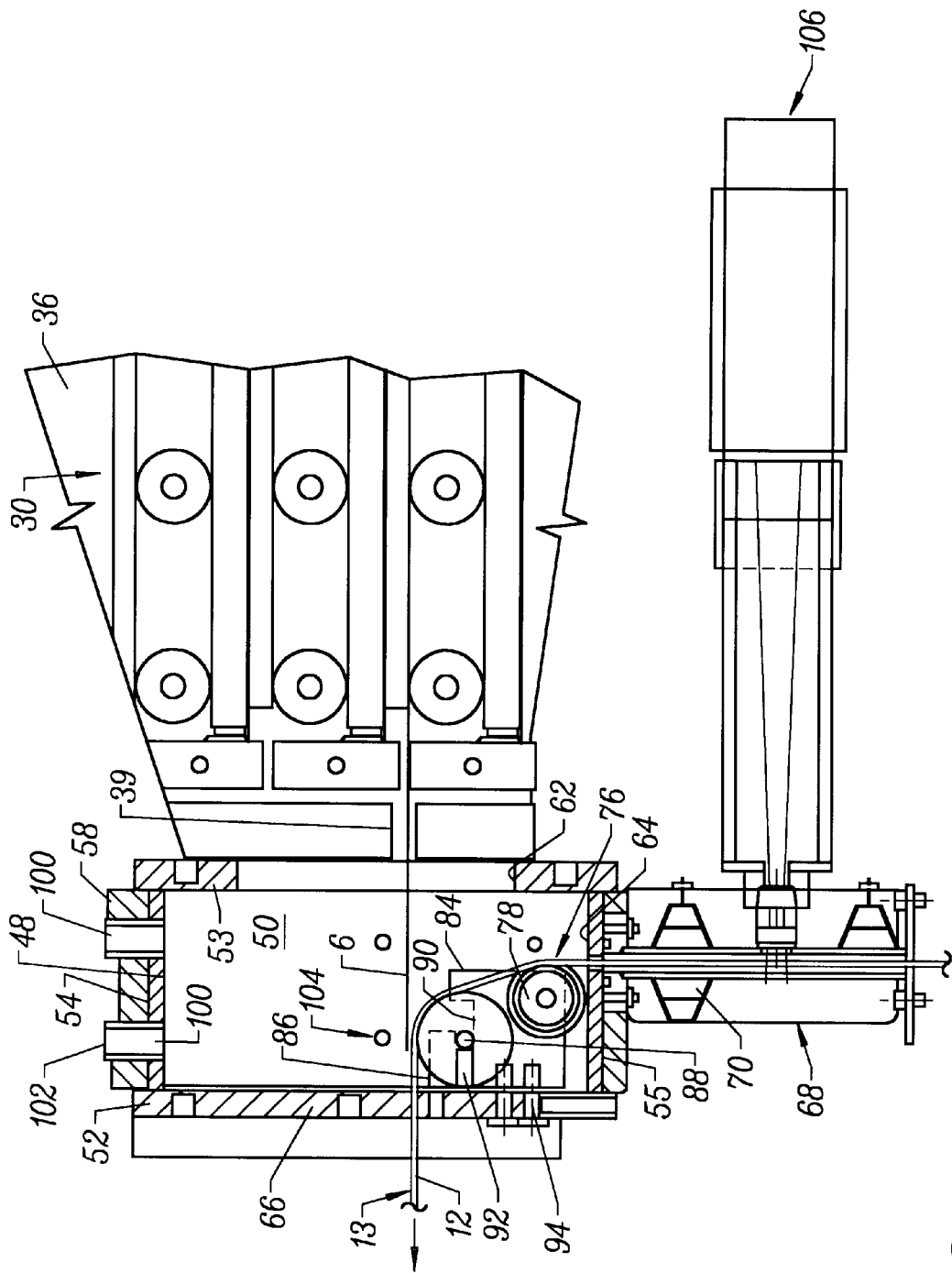
FIG. 3 is an enlarged front plan view, partially broken away, of the processing system 1 showing the substrate transfer station and thermal conditioning apparatus.
Figure 4:
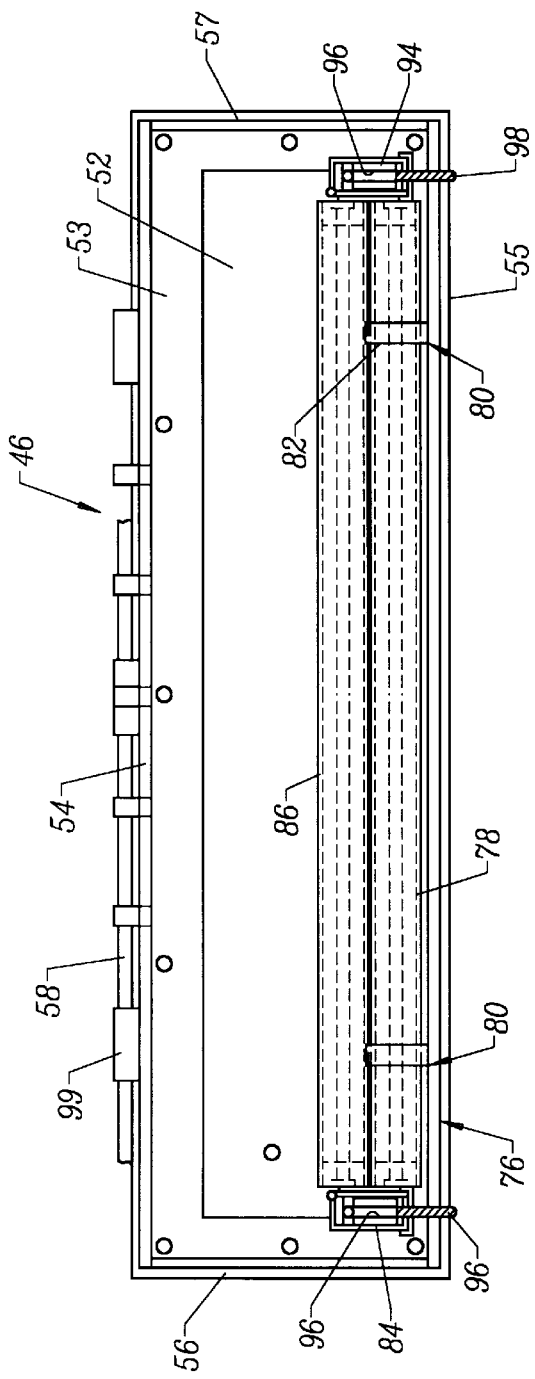
FIG. 4 is a side view, partially broken away, of the substrate transfer station of FIG. 1.
Figure 5:
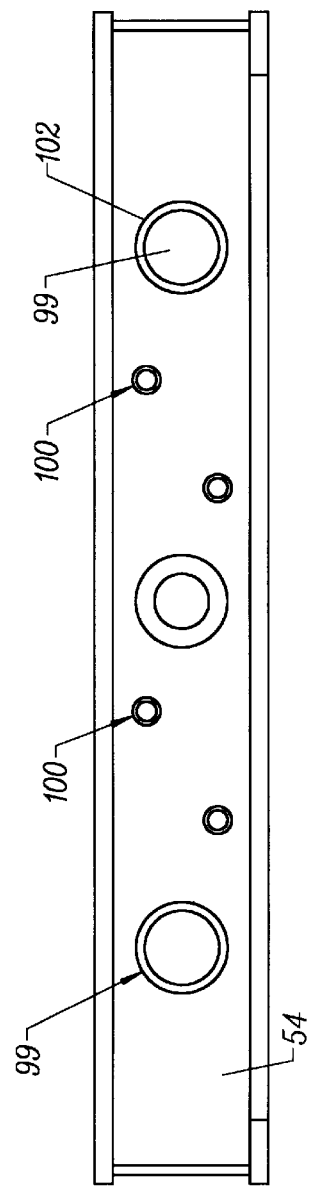
FIG. 5 is a top plan view of the substrate transfer station of FIG. 1, shown with the heating cover removed.

Turning to FIGS. 3–5, the substrate transfer station 46 includes a housing or enclosure 48 having an interior chamber 50 which is heated to an elevated temperature. The housing 48 is formed in the shape of a rectangular box, with the front, back, top and bottom walls 52–55 having a length greater than the width of the conveyor. However, it is to be understood that the shape of the housing is subject to variation within the scope of this invention. A heated cover 58 such as a heated jacket or blanket is wrapped around the exterior of the housing 50 and heats the interior chamber 50 to a predetermined temperature range and maintains the chamber at the selected temperature. In the illustrated embodiment, the cover 58 fits closely against the exterior of the top, bottom and end walls 54, 55, 56 and 57, leaving the front and back walls uncovered. Instead of the heated cover 58, it is to be understood that other means may be used to heat the interior of the housing. In the present application, the interior chamber 50 is heated to an elevated temperature in the range of 300° C. to 500° C., although it is to be understood that other processes may dictate different processing temperature ranges.

The substrate transfer station 46 includes two inlet ports, a substrate inlet port 62 and a conveyor inlet port 64, for separately receiving the pre-heated substrates 6 and conveyor 12 and a single outlet port 66 for the egress of the conveyor and substrate from the transfer station 46. The substrate inlet port 62 is formed in the back wall 53 of the substrate transfer station 46. The back wall 53 is mounted to the wall of the thermally conditioning apparatus 30 around the outlet port 39, aligning the substrate inlet port 62 with the outlet port 39. Eliminating a gap or space between the transfer station 46 and the thermal conditioning apparatus 30 is of particular advantage in that it minimizes heat loss and eliminates a possible entrance for contaminants into either the heating chamber 36 of the conditioning apparatus 30 or the interior chamber 50 of the transfer station 46.

The conveyor inlet port 64 is formed in the bottom wall 55 of the housing 42. In the illustrated embodiment of the invention, the conveyor inlet port 64 is a slit having a length and width slightly greater than the width and thickness of the conveyor belt, minimizing heat loss and reducing the risk of contaminants entering the chamber 50. Additional protection against contamination is provided by mounting an oxygen exclusion device 68 to the bottom wall 55 around the conveyor inlet port 64 which prepares the heated conveyor belt prior to entry into the clean environment of the chamber 50. As the conveyor 12 passes through the oxygen exclusion device 68, pre-heated nitrogen is injected through a plenum 70 to flush any entrapped contaminants or moisture from the belt weave. The nitrogen filled plenum also acts as a positive pressure curtain to prevent contamination from entering the substrate transfer station 46.

The outlet port 66 is formed in the front wall 52 of the housing 48. The front wall is mounted to the muffle enclosing the process path 13 of the conveyor 12, the reaction chambers 14, injectors 16 and the like. The outlet port 66 thus opens directly into the interior of the muffle 17, minimizing heat loss, protecting the clean gas environments of the process path 13 and the chamber 50 of the transfer station and preventing the entrainment of contaminants into the muffle 17 or substrate transfer station.

The substrate transfer station 46 includes a guide assembly such as roller assembly 76 for directing the conveyor 12 between the conveyor inlet port 64 and the outlet port 66. In the illustrated embodiment, the bottom wall 55 and front wall 52 are oriented at an angle of 90°, requiring the conveyor 12 be turned 90° between the conveyor inlet port 64 and the outlet port 66. Preferably, the conveyor 12 is substantially aligned with the plane of the outlet port 64 and process path before the substrate 6 contacts the upper surface of the conveyor to minimize stresses on the substrate.

Roller assembly 76 of the illustrated embodiment includes a first roller 78 mounted near the conveyor inlet port 64 for retaining the conveyor 12 in position as it travels through the chamber 50 of the transfer station 46. The roller 78 also adjusts the lateral position of the conveyor to substantially align the conveyor 12 with the process path 13. As shown particularly in FIG. 4, the exterior surface of the roller 78 is provided with spaced retaining collars 80. The collars 80 limit lateral movement of the conveyor belt 12 relative to the roller 78, thereby aligning the conveyor 12 with the process path 13. The inward facing edge of each collar is provided with a chamber 82 that corrects the lateral position of the conveyor if necessary. In the illustrated embodiment, the chamber 82 are oriented at an angle of 60° relative to the exterior surface of the roller. However, it is to be understood that collars 80 of other configurations may be used within the scope of this invention. Moreover, a roller having an exterior surface shaped with integral collars or projections for maintaining the lateral position of the conveyor belt may be employed instead of mounting collars 80 to the roller. The roller 78 is mounted in a fixed position, with the axis of the roller 78 parallel to the bottom wall 55 of the housing 48, by brackets 84. The roller 78 maintains the alignment of the conveyor through the inlet port 64 and the oxygen exclusion device 68 below.

The roller assembly 76 also includes a second roller 86 which adjusts the conveyor for proper tracking as it changes direction between the conveyor inlet port 64 and the outlet port 66, vertically aligning the conveyor 12 with the process path. The roller 86 is positioned proximate the outlet port 66 at a height such that the conveyor 12 leaves the roller 86 at the height of the process path 13. The roller 86 is supported within the chamber 50 by mounting pins 88 which are seated in slots 90 formed in the brackets 84. The orientation of the roller 86 relative to the front wall 52 may be adjusted to center the conveyor 12 by moving one or both pins 88 along the corresponding slot 90. In the illustrated embodiment, the passage of the conveyor 12 around the roller 86 urges the pins 88 against adjustment screws 92 which limit the forward movement of the pins 88. The position of the pins 88 within the slot is thereby adjusted by turning the adjustment screws in the appropriate direction. Preferably, the centering of the belt is monitored periodically during operation of the system 10 and the position of roller 86 adjusted as necessary. In the illustrated embodiment, the slot 90 is substantially horizontal such that all adjustment occurs in the horizontal plane. The vertically oriented forces imposed on the roller 86 by the conveyor 12 are applied to the bracket 84 rather than the movable adjustment screws 92 so that the vertical position of the roller 86 within the chamber 50 is continuously maintained by the brackets 84.

The brackets 84 are mounted to the housing 48 by mounting blocks 94. The mounting blocks 94 are seated in vertically extending channels 96 formed in the front wall 52 of the housing 48 and supported on vertical adjustment screws 98. The height of the rollers 78 and 86 within the chamber 50 as well as the parallelism of the rollers to the bottom wall 55 may be adjusted-using the vertical adjustment screws 98. Typically, this adjustment occurs only during the initial set-up of the substrate transfer station 46. Once the rollers are parallel to the floor of the chamber 50 and bottom wall 55 and the rollers are positioned at the proper height, the vertical adjustment screws are secured in place. Thus, the adjustment screws 98 are capable of withstanding downward directed forces caused by movement of the conveyor 12 through the transfer station 46.

Both rollers 78 and 86 bear the load of the 90° turn in direction of the conveyor 12 and are positioned relative to one another to minimize wear on the conveyor. However, it is to be understood that the actual position of the rollers may be varied within the scope of this invention. Moreover, a different roller assembly or other type of guide assembly may be used to turn the conveyor between the conveyor inlet port 64 and the outlet port 66.

In the illustrated embodiment of the invention, the substrate transfer station 46 does not include heating elements for directly heating the rollers. Instead, the rollers 78 and 86 are initially heated by the heat radiating from the walls of the housing 48 as well as the heat of the conveyor. Once the elevated temperature is reached, the temperature is efficiently maintained by these heat sources. However, it is to be understood that in other embodiments of the invention a heating element may be employed to control the temperature of the rollers directly.

Rollers 78 and 86 are made of stainless steel, and include silicon nitride ball bearings in 440C stainless races. The silicon nitride balls are self lubricating at high temperatures, eliminating a need for lubricants which may provide a potential source of contamination within the chamber 50. The 440C stainless steel employed in the races maintains a high hardness at process temperatures over 400° C.

During operation of the system 10, the location of the conveyor 12 and substrate 6 may be visually monitored through one or more sapphire windows 99 in the top wall 54. One or more pyrometer ports 100 are also provided in the top wall for measuring the temperature of the conveyor 12 and substrate 6. As is shown particularly in FIGS. 3 and 4, the windows 99 and ports 100 are surrounded by chimneys 102 which project from the top wall and extend through holes formed in the cover 58. One or more sample ports 104 are formed in one or both of the end walls 56, 57. The sample ports 104 may be used to periodically test the atmosphere of the internal chamber 50. In the illustrated embodiment, an additional pyrometer 106 is employed to monitor the temperature of the conveyor 12 as the conveyor passes through the oxygen exclusion device 68.

Once the substrate has been heated to the appropriate temperature in the heating chamber 36, the substrate is ejected from the carriage 34 and moved through the outlet port 39 and substrate inlet port 62 and into the chamber 50 of the transfer station. As the substrate is moved forward, the forward end of the substrate is positioned on the upper surface of the conveyor. Preferably, the substrate is moving at the same speed as the conveyor when the substrate contacts the conveyor. As the conveyor 12 and substrate 6 continue to move forward, the conveyor 12 carries the substrate through the outlet port 66 and into the muffle 17 where the substrate is moved along the process path 13. Thus, the pre-heated substrate is transferred to the pre-heated conveyor in a thermally-controlled, clean, high temperature environment. Temperature gradients and contamination are minimized.

After the substrate has been carried through the reaction chambers 14, the substrate is transferred to the conditioning apparatus 32 for cooling. Preferably, a second substrate transfer apparatus 110 is provided between the muffle 17 and the conditioning apparatus 32. The substrate transfer apparatus 110 is substantially identical to the transfer apparatus 46, except that the apparatus 110 is reversed relative to the transfer apparatus 46 and the movement of the conveyor and substrate through the transfer apparatus is reversed. The outlet port 66 of the transfer apparatus 46 becomes a single inlet port of the second transfer apparatus, while the substrate inlet port and conveyor inlet port become a substrate outlet port and conveyor outlet port. With substrate transfer apparatus 110, the hot processed substrate is efficiently removed from the conveyor and delivered to the conditioning apparatus 32 for cooling in a clean, uniform temperature environment, protecting the fragile substrate from damage or contamination during the transfer.

The conditioning apparatus 32 cools the substrates 6, which typically leave the third reactor at a temperature of about 430° C., to a manageable temperature of about 60° C. or lower. Processed substrates are inserted through the inlet port formed in the front wall 116 of the conditioning apparatus 32 and deposited on carriage 118 positioned in the cooling chamber 120. The carriage 118 is indexed within the chamber 120 to align consecutive shelves with one of the outlet ports formed in the back wall 122 for removal of a cooled substrate from the carriage 118. As with conditioning apparatus 30, the timing and movement of the carriage 118 relative to the inlet and outlet ports of the cooling chamber 120 is arranged such that each substrate remains in the chamber until the substrate has reached the desired temperature.

A robotic handling assembly 126 delivers substrates from a supply station 128 to the conditioning apparatus 30 while robotic handling assembly 130 removes substrates from conditioning apparatus 32 and transfers the processed substrates to the finished station 132.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best use the invention and various embodiments with various modifications as are suited to the particular use contemplated. It is intended that the scope of the invention be defined by the claims appended hereto and their equivalents.

What is claimed is:

1. A system for processing a substrate comprising:

a substrate heating station for heating a substrate to an elevated temperature;

a processing station for treating the heated substrate, said processing station including at least one injector for supplying a reagent to said processing station;

a conveyor for transporting the heated substrate from said substrate heating station to said processing station;

a conveyor heating station for heating said conveyor to an elevated temperature before the heated substrate is positioned on said conveyor for delivery to said processing station;

a substrate transfer station located between said substrate heating station, said conveyor heating station and said processing station for the transfer of the heated substrate to said conveyor, said substrate transfer station including a housing having a substrate inlet port positioned to receive a heated substrate from said substrate heating station, a conveyor inlet port for the entry of said conveyor into said housing, and an outlet port for the egress of said conveyor and a heated substrate positioned thereon, said substrate transfer station including a heater for heating the interior of said housing to an elevated temperature and a guide assembly redirecting said conveyor between said conveyor inlet and said outlet.

2. The processing system of claim 1 in which said heater is a heated cover positioned around said housing.

3. The processing system of claim 1 in which said conveyor inlet port and said outlet are positioned such that said conveyor passes through said inlet port in a first direction and passes through said outlet port in a second direction oriented at an angle of about 90° relative to the first direction.

4. The processing system of claim 1 in which said guide assembly is heated to an elevated temperature by at least one of said conveyor and said housing.

5. The processing system of claim 1 in which said guide assembly includes a first roller supporting said conveyor in a selected position as said conveyor travels through said housing and a second roller aligning said conveyor with the path extending between said substrate transfer station and said processing station.

6. The processing system of claim 5 in which said first roller includes outer collars positioned on opposite sides of said conveyor, said collars being tapered to limit lateral movement of said conveyor relative to said first roller.

7. The processing system of claim 5 in which said second roller is movable in a lateral direction relative to said housing to center said conveyor relative to the path between said processing station and said substrate transfer station.

8. The processing system of claim 1 in which said substrate, said conveyor and said substrate transfer station are heated to a temperature in the range of 300° C. to 550° C.

9. The processing system of claim 1, and further comprising at least one temperature measuring device positioned to measure the temperature of one of a heated substrate and said conveyor in said housing.

10. A substrate transfer station for a processing system of the type including a conveyor for transporting a substrate through a reaction chamber, said substrate transfer station comprising:

a housing having an interior chamber formed therein, said housing including a first inlet for the passage of a substrate into said interior chamber, a second inlet for the passage of a conveyor into said interior chamber, and an outlet for the egress of the substrate and conveyor from said interior chamber;

a heater for heating said interior chamber to an elevated temperature;

a guide assembly for directing the conveyor between said conveyor inlet and said outlet as the conveyor passes through said interior chamber.

11. The substrate transfer station of claim 10, and further comprising a substrate heating station positioned upstream of said substrate inlet for heating a substrate to an elevated temperature before the substrate is moved through said substrate inlet and into said interior chamber.

12. The substrate transfer station of claim 10, and further comprising a conveyor heating station positioned upstream of said conveyor inlet for heating the conveyor to an elevated temperature before the conveyor is moved through said conveyor inlet and into said chamber.

13. The substrate transfer station of claim 10 in which said guide assembly includes at least one roller.

14. The substrate transfer station of claim 10 in which said heater is a heated cover mounted to the exterior of said housing.

15. A method of processing a substrate comprising the steps of:

heating a substrate to an elevated temperature;

heating a conveyor to an elevated temperature and moving the heated conveyor through an enclosure having an interior chamber heated to an elevated temperature, an inlet port for the passage of the heated conveyor into the interior chamber, and an outlet port for the egress of the heated conveyor from the interior chamber;

after the step of heating a substrate, moving the heated substrate into the enclosure through a separate inlet port and positioning the heated substrate on the heated conveyor in the interior chamber;

moving the heated conveyor with the heated substrate positioned thereon through the outlet port of the enclosure; and moving the heated conveyor and the heated substrate through at least one processing station for processing of the heated substrate.

16. The method of claim 15 in which the steps of heating the substrate and heating the conveyor include heating the substrate and the conveyor to an elevated temperature in the range of 300° C. to 550° C.

17. The method of claim 15, and further comprising the step of heating the interior chamber of the enclosure to an elevated temperature of 300° C. to 550° C.

18. The method of claim 15 in which the step of moving the heated conveyor through an enclosure includes turning the conveyor around a bend having an angle of about 90° between the inlet port and the outlet port of the enclosure.

* * * * *